(12) United States Patent
Yoshida

(10) Patent No.: US 9,543,164 B2
(45) Date of Patent: Jan. 10, 2017

(54) ETCHING METHOD

(71) Applicant: Tokyo Electron Limited, Tokyo (JP)

(72) Inventor: Ryoichi Yoshida, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 99 days.

(21) Appl. No.: 14/555,826

(22) Filed: Nov. 28, 2014

(65) Prior Publication Data

US 2015/0162202 A1     Jun. 11, 2015

(30) Foreign Application Priority Data

Dec. 10, 2013 (JP) ................................ 2013-255349

(51) Int. Cl.
| | |
|---|---|
| *H01L 21/302* | (2006.01) |
| *H01L 21/461* | (2006.01) |
| *H01L 21/311* | (2006.01) |
| *H01L 21/3213* | (2006.01) |
| *H01L 21/027* | (2006.01) |
| *H01J 37/32* | (2006.01) |

(52) U.S. Cl.
CPC .... *H01L 21/31116* (2013.01); *H01J 37/32091* (2013.01); *H01L 21/0273* (2013.01); *H01L 21/31138* (2013.01); *H01L 21/32137* (2013.01); *H01L 21/32139* (2013.01); *H01J 2237/334* (2013.01)

(58) Field of Classification Search
CPC .................... H01L 21/31116; H01L 21/31138; H01L 21/32137; H01L 21/32139
USPC ............................................. 216/99; 438/710
See application file for complete search history.

(56) References Cited

U.S. PATENT DOCUMENTS

| | | | |
|---|---|---|---|
| 2005/0054209 A1* | 3/2005 | Hsu ..................... | H01L 21/2652 438/725 |
| 2008/0038926 A1* | 2/2008 | Ventzek ............ | H01J 37/32027 438/706 |

FOREIGN PATENT DOCUMENTS

| | | |
|---|---|---|
| JP | 2003-506866 | 2/2003 |
| WO | 01/09934 | 2/2001 |

\* cited by examiner

*Primary Examiner* — Roberts Culbert
(74) *Attorney, Agent, or Firm* — IPUSA, PLLC

(57) ABSTRACT

An etching method is provided for performing an etching process on an etching target film arranged on a substrate. The etching method includes the steps of supplying a treatment gas including a halogen-containing gas, hydrogen gas, an inert gas, and oxygen gas; performing a treatment on a patterned mask arranged on the etching target film using a plasma generated from the treatment gas; and etching the etching target film that has undergone the treatment using a plasma generated from an etching gas.

3 Claims, 17 Drawing Sheets (A) MASK TREATMENT (B) FIRST ETCHING (C) SECOND ETCHING (D) THIRD ETCHING

FIG.4

| | CD | | |
|---|---|---|---|
| | LINE CD | HOLE CD (LONG DIAMETER) | HOLE CD (SHORT DIAMETER) |
| MASK TREATMENT 5 [S] / AFTER FULL ETCHING | | | |
| CD BIAS | 14.3 | 17.4 | 14.0 |
| CD BIAS MAX-MIN | — | 3.4 | |
| SHRINK RATIO | — | 1.22 | 0.98 |

FIG.5

| | CD | | | |
|---|---|---|---|---|
| | LINE CD | HOLE CD (LONG DIAMETER) | HOLE CD (SHORT DIAMETER) |
| MASK TREATMENT 7 [S] ---- AFTER FULL ETCHING | | | |
| CD BIAS | 10.4 | 9.4 | 11.3 |
| CD BIAS MAX-MIN | — | 1.9 | |
| SHRINK RATIO | | 0.90 | 1.08 |

FIG.6

| MASK TREATMENT 10 [S] | LINE CD | CD | |
|---|---|---|---|
| | | HOLE CD (LONG DIAMETER) | HOLE CD (SHORT DIAMETER) |
| AFTER FULL ETCHING | | | |
| CD BIAS | 7.3 | 5.7 | 8.6 |
| CD BIAS MAX–MIN | — | 2.9 | |
| SHRINK RATIO | | 0.79 | 1.18 |

FIG.8

| | LINE CD | CD | |
|---|---|---|---|
| | | HOLE CD (LONG DIAMETER) | HOLE CD (SHORT DIAMETER) |
| MASK TREATMENT 5 [S] / AFTER FIRST ETCHING | | | |
| CD BIAS | 29.2 | 30.8 | 27.0 |
| CD BIAS MAX-MIN | — | 3.8 | |
| SHRINK RATIO | | 1.05 | 0.92 |

FIG.9

| | LINE CD | HOLE CD (LONG DIAMETER) | HOLE CD (SHORT DIAMETER) |
|---|---|---|---|
| MASK TREATMENT 7 [S] ---- AFTER FIRST ETCHING | | | |
| CD BIAS | 21.6 | 19.5 | 21.2 |
| CD BIAS MAX-MIN | — | 2.1 | |
| SHRINK RATIO | | 0.90 | 0.98 |

FIG.10

| MASK TREATMENT 10 [S] / AFTER FIRST ETCHING | LINE CD | CD | |
|---|---|---|---|
| | | HOLE CD (LONG DIAMETER) | HOLE CD (SHORT DIAMETER) |
| CD BIAS | 13.6 | 9.8 | 12.9 |
| CD BIAS MAX-MIN | — | 3.8 | |
| SHRINK RATIO | | 0.72 | 0.95 |

FIG.12

| | LINE CD | CD HOLE CD (LONG DIAMETER) | HOLE CD (SHORT DIAMETER) |
|---|---|---|---|
| MASK TREATMENT 7 [S] / AFTER MASK TREATMENT | | | |
| CD BIAS | 4.0 | 4.1 | 2.4 |
| CD BIAS MAX−MIN | — | 1.7 | |
| SHRINK RATIO | | 1.04 | 0.60 |

FIG.13

| | LINE CD | CD | |
|---|---|---|---|
| | | HOLE CD (LONG DIAMETER) | HOLE CD (SHORT DIAMETER) |
| MASK TREATMENT 10 [S] | | | |
| AFTER FIRST ETCHING | 15.6 | 16.0 | 16.6 |
| CD BIAS | — | 1.0 | |
| CD BIAS MAX-MIN | | | |
| SHRINK RATIO | — | 1.02 | 1.07 |

FIG.15

| MASK TREATMENT 20 [S]<br>H₂/Ar<br>AFTER MASK TREATMENT | LINE CD | CD | |
|---|---|---|---|
| | | HOLE CD (LONG DIAMETER) | HOLE CD (SHORT DIAMETER) |
| CD BIAS | 6.0 | 10.4 | 6.2 |
| CD BIAS MAX-MIN | — | 4.4 | |
| SHRINK RATIO | — | 1.73 | 1.02 |

FIG.16

| MASK TREATMENT 5 [S]<br>----<br>$H_2/N_2$<br>----<br>AFTER MASK TREATMENT | LINE CD | CD | |
|---|---|---|---|
| | | HOLE CD (LONG DIAMETER) | HOLE CD (SHORT DIAMETER) |
| CD BIAS | 8.7 | 15.2 | 8.0 |
| CD BIAS MAX-MIN | — | 7.2 | |
| SHRINK RATIO | — | 1.75 | 0.92 |

FIG.17

| MASK TREATMENT 5 [S] / CF₄ / AFTER MASK TREATMENT | LINE CD | HOLE CD (LONG DIAMETER) | HOLE CD (SHORT DIAMETER) |
|---|---|---|---|
| | 13.8 | 15.6 | 12.5 |
| CD BIAS | — | 3.1 | |
| CD BIAS MAX-MIN | | | 12.5 |
| SHRINK RATIO | | 1.13 | 0.91 |

ETCHING METHOD

CROSS-REFERENCE TO RELATED APPLICATIONS

This patent application is based upon and claims the benefit of priority of Japanese Patent Application No. 2013-255349 filed on Dec. 10, 2013, the entire contents of which are incorporated herein by reference.

BACKGROUND OF THE INVENTION

1. Field of the Invention

The present invention generally relates to an etching method.

2. Description of the Related Art

With the growing miniaturization of etching patterns, precision of the dimensions of patterns formed by etching is becoming an important technical issue. In particular, when the aspect ratio of an etched pattern increases, the dimensions of the etched pattern is prone to degradation. In this respect, PCT Japanese Translation Patent Publication No. 2003-506866 discloses a technique for reducing critical dimension (CD) microloading, which refers to a degradation in the precision of dimensions of a pattern and a decrease in the etch rate as the aspect ratio of the pattern being formed increases.

Also, in view of the miniaturization of patterns, a technique is known for shrinking the critical dimensions (CD) of an etching pattern to reduce the dimensions of a pattern to be etched. In the next generation, pattern miniaturization is expected to progress further, and as such, controlling the shrinkage of the vertical and horizontal CD of a pattern upon shrinking the CD may be important. Normally, the vertical to horizontal CD shrink ratio upon shrinking the CD of a pattern is preferably controlled to be 1:1.

However, in the case of shrinking an oval hole pattern, for example, the long diameter of the hole pattern normally shrinks by a greater amount compared to the short diameter, and it is difficult to control the long diameter to short diameter CD shrink ratio to 1:1.

SUMMARY OF THE INVENTION

In view of the above, an aspect of the present invention relates to providing an etching method that enables controlling the CD shrink ratio of an etching pattern.

According to one embodiment of the present invention, an etching method is provided for performing an etching process on an etching target film arranged on a substrate. The etching method includes the steps of supplying a treatment gas including a halogen-containing gas, hydrogen gas, an inert gas, and oxygen gas; performing a treatment on a patterned mask arranged on the etching target film using a plasma generated from the treatment gas; and etching the etching target film that has undergone the treatment using a plasma generated from an etching gas.

BRIEF DESCRIPTION OF THE DRAWINGS

FIG. 4 illustrates exemplary results of performing an etching method according to an embodiment of the present invention;

FIG. 5 illustrates exemplary results of performing an etching method according to an embodiment of the present invention;

FIG. 6 illustrates exemplary results of performing an etching method according to an embodiment of the present invention;

FIG. 8 illustrates exemplary results of performing an etching method according to an embodiment of the present invention;

FIG. 9 illustrates exemplary results of performing an etching method according to an embodiment of the present invention;

FIG. 10 illustrates exemplary results of performing an etching method according to an embodiment of the present invention;

FIG. 12 illustrates exemplary results of performing an etching method according to an embodiment of the present invention;

FIG. 13 illustrates exemplary results of performing an etching method according to an embodiment of the present invention;

FIG. 15 illustrates exemplary results of performing an etching method according to an embodiment of the present invention;

FIG. 16 illustrates exemplary results of performing an etching method according to an embodiment of the present invention; and FIG. 17 illustrates exemplary results of performing an etching method according to an embodiment of the present invention.

DETAILED DESCRIPTION OF THE PREFERRED EMBODIMENTS

In the following, embodiments of the present invention are described with reference to the accompanying drawings. Note that elements described below having substantially identical features are given the same reference symbols and overlapping descriptions thereof may be omitted.

[Etching Apparatus Configuration]

Figure 1:
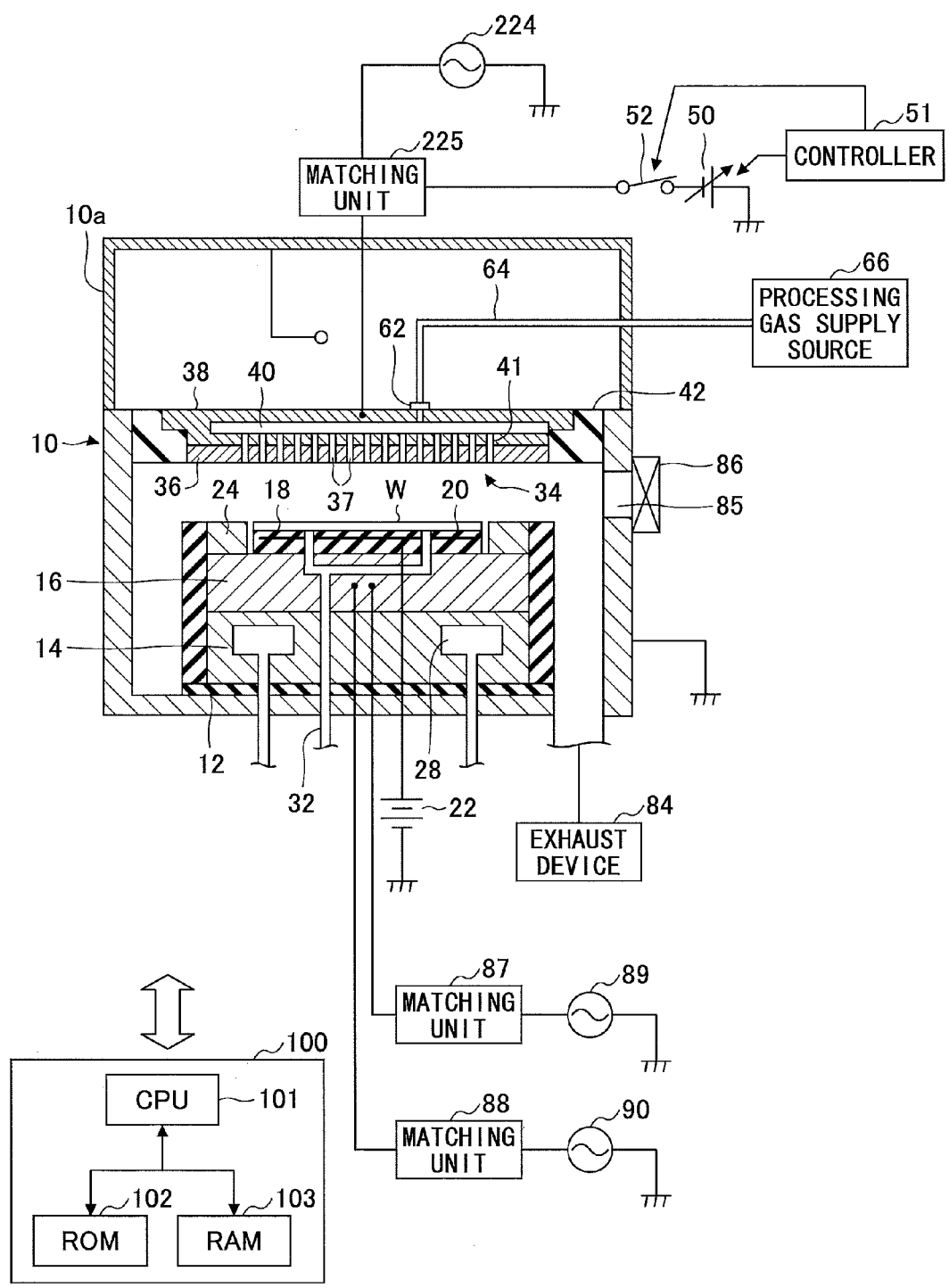
FIG. 1 illustrates an overall configuration of an etching apparatus according to an embodiment of the present invention.

In the following, an overall configuration of an etching apparatus according to an embodiment of the present invention is described with reference to FIG. 1. FIG. 1 is a longitudinal cross-sectional view of an etching apparatus according to an embodiment of the present invention.

The etching apparatus according to the present embodiment is configured as a capacitively coupled parallel plate plasma etching apparatus including a cylindrically-shaped chamber 10 made of aluminum having an alumite-treated (anodized) surface, for example. The chamber 10 is grounded. A cylindrical susceptor support 14 is arranged at the bottom of the chamber 10 via an insulating plate 12 that may be made of ceramic, for example. A susceptor 16 that may be made of aluminum, for example, is arranged on the susceptor support 14. The susceptor 16 corresponds to a lower electrode, and a substrate such as a semiconductor wafer (referred to as "wafer W" hereinafter) may be placed on the susceptor 16.

An electrostatic chuck 18 for electrostatically attracting the wafer W by electrostatic force is arranged on an upper surface of the susceptor 16. The electrostatic chuck 18 includes an electrode 20 made of a conductive film that is interposed between a pair of insulating layers or insulating sheets. A DC power supply source 22 is connected to the electrode 20. When a voltage is supplied from the DC power supply source 22, the wafer W is electrostatically attracted to the electrostatic chuck 18 by a Coulomb force. A focus ring 24 for improving in-plane etching uniformity is arranged on the upper surface of the susceptor 16 around the periphery of the electrostatic chuck 18.

A cooling chamber 28 is arranged inside the susceptor support 14 along a circumference of the susceptor support 14, for example. The cooling chamber 28 may be connected to an external chiller unit (not shown) via a pipe, and a coolant such as cooling water at a predetermined temperature may be supplied to the cooling chamber 28 from the chiller unit and circulated within the cooling chamber 28. In this way, a processing temperature of the wafer W arranged on the susceptor 16 may be controlled by the temperature of the coolant, for example. Further, a heat transfer gas such as helium (He) gas may be supplied from a heat transfer gas supply mechanism via a gas supply line 32 to be supplied between an upper surface of the electrostatic chuck 18 and a bottom surface of the wafer W.

An upper electrode 34 is arranged above the susceptor 16 (lower electrode) facing parallel to the susceptor 16. The space between the upper electrode 34 and the lower electrode (susceptor 16) corresponds to a plasma generation space. The upper electrode 34 has a surface that is in contact with the plasma generation space and faces opposite the wafer W arranged on the lower electrode (susceptor 16).

The upper electrode 34 is supported at an upper part of the chamber 10 via an insulating shield member 42. The upper electrode 34 includes an electrode support 38 that detachably holds an electrode plate 36 and an electrode plate 37. The electrode plate 36 has a surface facing opposite the susceptor 16 and includes multiple gas holes 37. The electrode plate 36 is preferably made of a low-resistance conductor or semiconductor that releases a relatively small amount of Joule heat. The electrode support 38 is made of a conductive material such as aluminum having an alumite-treated (anodized) surface, for example, and includes a water cooling structure. A gas diffusion chamber 40 is arranged inside the electrode support 38, and multiple gas passage holes 41 communicating with the gas holes 37 are arranged to extend downward from the gas diffusion chamber 40.

A gas inlet port 62 is formed at the electrode support 38 for introducing processing gas into the gas diffusion chamber 40, the gas inlet port 62 is connected to a gas supply pipe 64, and the gas supply pipe 44 is connected to a processing gas supply source 66. Etching gas output from the processing gas supply source 66 passes through the gas supply pipe 64 to reach the gas diffusion chamber 40. The etching gas then passes through the gas holes 37 and the gas passage holes 41 to be showered into the plasma generation space. That is, the upper electrode 34 acts as a showerhead for supplying processing gas into the chamber 10.

A first high frequency power (RF power) may be applied to the susceptor 16 corresponding to the lower electrode from a first high frequency power source 89 via a matching unit 87. Also, a second high frequency power may be applied to the susceptor 16 from a second high frequency power source 90 via a matching unit 88. Further, a third high frequency power may be applied to the upper electrode 34 from a third high frequency power source 224 via a matching unit 225. Note that in the etching apparatus according to the present embodiment, the third high frequency power source 224 preferably corresponds to a high frequency power source that outputs a high frequency power for plasma generation, and the first high frequency power source 89 and the second high frequency power source 90 preferably correspond to high frequency power sources that output high frequency powers for drawing ions.

A variable DC power source 50 is connected to the upper electrode 34 via the matching unit 225, and power supply to the variable DC power source 50 may be turned on/off by an on/off switch 52. The polarity and current/voltage of the variable DC power source 50 and the on/off state of the on/off switch 52 are controlled by a controller 51.

An exhaust device 84 is connected to the bottom of the chamber 10 via an exhaust pipe. The exhaust device 84 includes a vacuum pump such as a turbo molecular pump and is configured to reduce the pressure within the chamber 10 to a desired degree of vacuum. Also, a transfer port 85 for the wafer W is arranged at a sidewall of the chamber 10, and the transfer port 85 can be opened and closed by a gate valve 86.

The various components of the etching apparatus according to the present embodiment are controlled by a control unit 100. The control unit 100 includes a CPU (Central Processing Unit) 101, a ROM (Read Only Memory) 102, and a RAM (Random Access Memory) 103. The CPU 101 executes an etching process according to various recipes stored in a storage unit such as the ROM 102. The recipes may include apparatus control information according to various process conditions. For example, the recipes may include apparatus control information describing a processing time, chamber temperatures (e.g., upper electrode temperature, side wall temperature of processing chamber, ESC temperature), a pressure (gas evacuation), a high frequency power/voltage, a processing gas flow rate, and/or a transfer gas flow rate.

Note that the functions of the control unit 100 may be implemented by software and/or hardware.

When performing an etching process in the etching apparatus of the present embodiment having the configuration as described above, first, the gate valve 86 is opened, and the wafer W corresponding to the etching target is introduced into the chamber 10 via the transfer port 85 and placed on the susceptor 16. Then, a DC voltage from the DC power source 22 is applied to the electrode 20 of the electrostatic chuck 18 such that the wafer W may be electrostatically attracted to the susceptor 16.

Then, a processing gas for etching is supplied at a predetermined flow rate from the processing gas supply source 66 to the gas diffusion chamber 40. The etching gas is then supplied to the chamber 10 via the gas passage holes 41 and the gas holes 37. Also, air is evacuated from the chamber 10 by the exhaust device 84 such that the pressure within the chamber 10 may be controlled to a preset value within a range of 0.1 Pa to 150 Pa, for example.

With the etching gas introduced into the chamber 10, a high frequency power for plasma generation at a predetermined power is applied to the upper electrode 34, and a high frequency power for drawing ions at a predetermined power is applied to the susceptor 16 corresponding to the lower electrode. In this way, a plasma may be generated from the etching gas, and the wafer W may be etched by the generated plasma.

[Etching Method]

Figure 2:
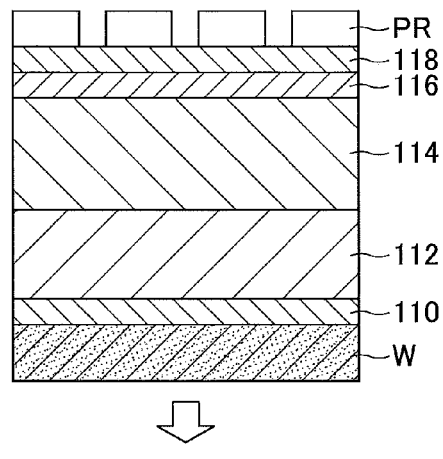
FIG. 2 illustrates an example of an etching target film according to an embodiment of the present invention.
Figure 2:
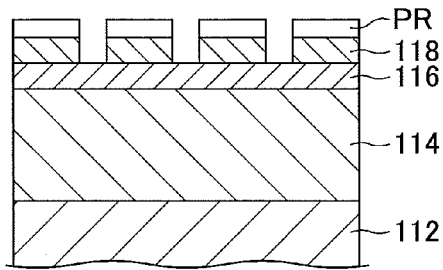
Figure 2:
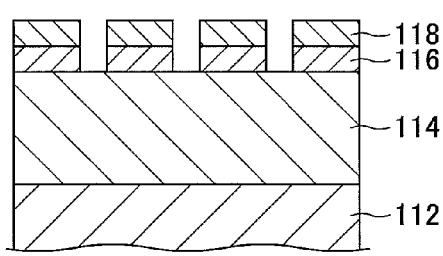
Figure 2:
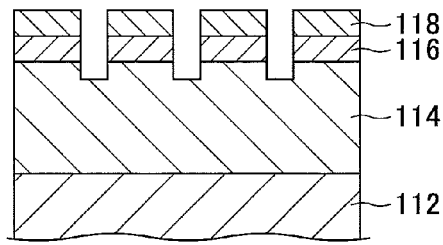

In the following, an etching method according to an embodiment of the present invention is described. FIG. 2 illustrates an example of an etching target film that may be subject to an etching process by the etching method according to the present embodiment.

(Etching Target Film)

The etching target film has a titanium nitride (TiN) film 110, a silicon oxide film 112, a polysilicon film 114, an organic film 116, and an anti-reflection film (Si-ARC) 118 formed on the wafer W in this order. Also, a patterned mask PR is formed on the anti-reflection layer 118.

The titanium nitride film 110 may be deposited on the wafer W by sputtering using a TiN target, for example. The silicon oxide film 112 may be deposited on the titanium nitride film 110 by plasma CVD using tetraethoxysilane (TEOS) as a raw material, for example. The polysilicon film 114 may be formed on the silicon oxide film 112 by plasma CVD. The organic layer 116 may be formed on the polysilicon film 114 using a spin-on material containing an organic material as a main component, for example.

The anti-reflection film 118 and a photoresist film (not shown) are successively formed on the upper surface of the organic film 116, and the photoresist film is patterned by photolithography to form the mask PR. The mask PR may have a linear pattern extending in one direction, or a circular pattern, for example.

Note that the etching target film subject to an etching process by the etching method according to the present embodiment is not limited to the layered film described above, and may be any silicon-containing film. Examples of a silicon-containing film include films made of a silicon oxide, a silicon nitride, a polysilicon, a metal silicide, and a single crystal silicon. Also, the wafer W may have films made of other materials formed thereon such as a metal conductive film, an insulating film, an anti-reflection film, and a diffusion film, for example.

(Etching Method)

Figure 3:
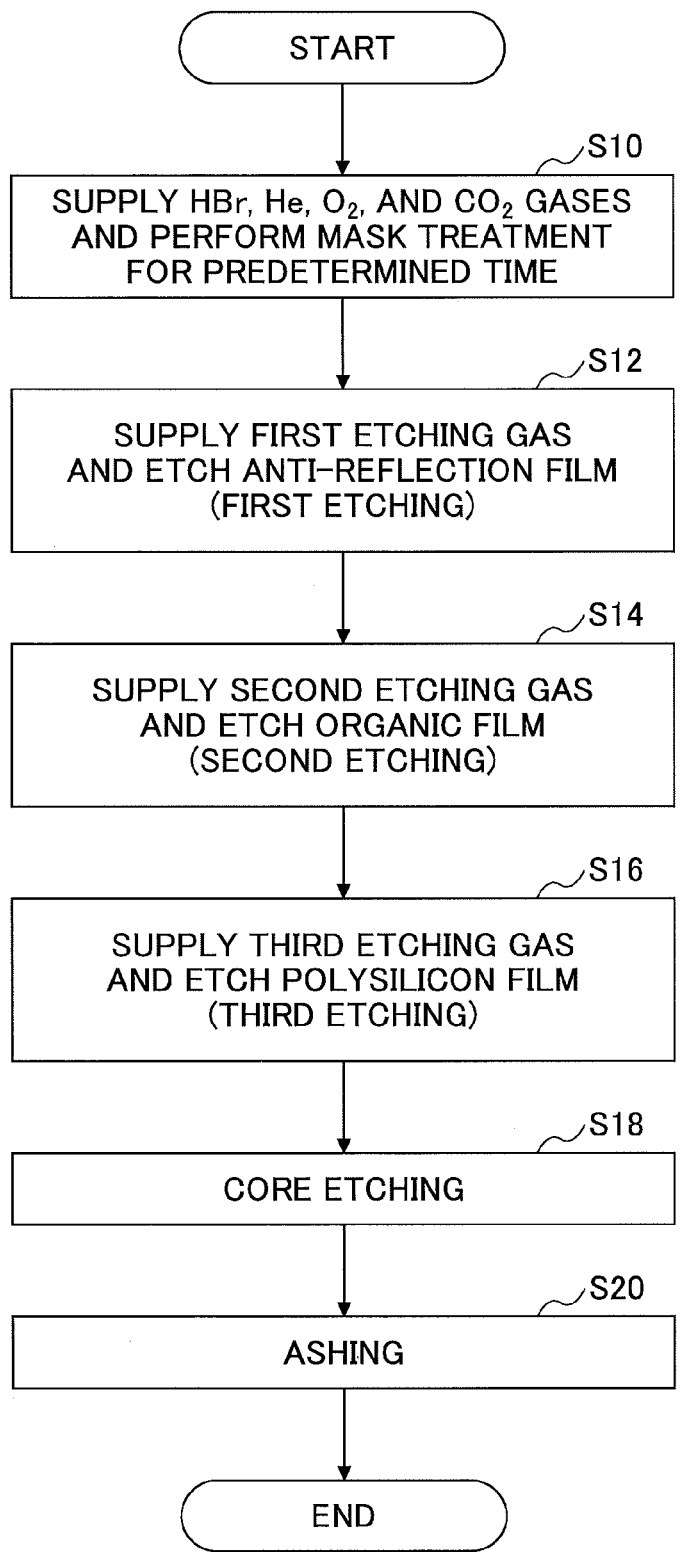
FIG. 3 is a flowchart illustrating an exemplary etching method according to an embodiment of the present invention.

As illustrated in FIG. 3, in the etching method according to the present embodiment, a mask treatment is performed on the mask PR before performing an etching process. That is, in step S10, a treatment gas including hydrogen bromide (HBr) gas, helium (He) gas, oxygen ($O_2$) gas, and carbon dioxide ($CO_2$) gas is supplied to the chamber 10, and a plasma generated from the treatment gas by applying a high frequency power is used to perform a mask treatment on the mask PR for a predetermined time period (e.g. 5 seconds, 7 seconds, 10 seconds, etc.). In this way, the mask PR may be trimmed and residue from resist development may be removed. By performing such a mask treatment, the mask PR that is tapered may be shaped to be substantially vertical, for example. In this way, controllability of the vertical to horizontal CD shrink ratio in the subsequent etching process may be improved.

Note that the gas mixture including hydrogen bromide (HBr) gas, helium (He) gas, oxygen ($O_2$) gas, and carbon dioxide ($CO_2$) gas is one example of a treatment gas. In other examples, the treatment gas does not have to include carbon dioxide ($CO_2$) gas. Although the treatment gas has to include an inert gas, the treatment gas does not have to include helium (He) gas and may instead include argon (Ar) gas, for example. That is, the treatment gas may be any gas including a halogen-containing gas, hydrogen gas, an inert gas, and oxygen gas.

After a mask treatment is performed on the patterned mask PR as illustrated in FIG. 2 (a), etching processes are performed as illustrated in FIG. 2 (b)-(d). In the following, the etching processes of FIG. 2 (b)-(d) are described with reference to FIG. 3.

In step S12, a first etching gas is supplied to etch the anti-reflection film 118. Note that the process step of etching the anti-reflection film 118 as illustrated in FIG. 2 (b) is referred to as "first etching".

Then, in step S14, a second etching gas is supplied to etch the organic film 116. Note that the process step of etching the organic film 116 as illustrated in FIG. 2 (c) is referred to as "second etching".

Then, in step S16, a third etching gas is supplied to etch a portion of the polysilicon film 114. Note that the process step of etching a portion of the polysilicon film 114 as illustrated in FIG. 2 (d) is referred to as "third etching".

Then, in step S18, the remaining portion of the polysilicon film 114 is etched, and in step S20 an ashing process is performed after which the present etching process is ended. Note that the etching process of step S18 is referred to as "core etching".

In the above first through third etching process steps, the CD is shrunk during etching to facilitate fine processing. The CD shrink ratio is preferably controlled such that the vertical to horizontal CD shrink ratio may be close to 1:1. In the etching method according to the present embodiment, a mask treatment is performed before etching, and in this way, the mask shape may be suitably adjusted. By performing such a mask treatment to adjust the mask shape before etching, controllability of the CD shrink ratio during etching may be improved, for example.

[Etching Results]

In the following, examples of CD shrink ratios obtained as a result of performing the etching method according to the present embodiment are described. FIGS. 4-6 illustrate top views of mask patterns and CD values related to CD shrink ratios obtained after performing the etching process from the first etching to the ashing process (also referred to as "full etching" hereinafter).

(Full Etching Result 1: Mask Treatment Time 5 Seconds)
<Process Conditions>

In the present example, the following process conditions were used.

(Mask Treatment)
High Frequency (HF): 500 W
High Frequency (LF): 75 W
Gas: $HBr/He/O_2/CO_2=40\sim70/140\sim220/10\sim30/20\sim50$ sccm
Processing Time: 5 seconds
(First Etching)
High Frequency (HF): 500 W
High Frequency (LF): 100 W
Gas: $CF_4/CH_4=160\sim240/5\sim20$ sccm
Processing Time: 45 seconds
(Second Etching)
High Frequency (HF): 200 W
High Frequency (LF): 100 W
Gas: $HBr/He/O_2/CO_2=20\sim40/160\sim240/30\sim50/60\sim100$ sccm
Processing Time: 1 minute 3 seconds
(Third Etching)
High Frequency (HF): 650 W
High Frequency (LF): 100 W
Gas: $CF_4=160\sim240$ sccm
Processing Time: 23 seconds (Fourth Etching (Core Etching))
High Frequency (HF): 300 W
High Frequency (LF): 90 W
Gas: HBr/He/O$_2$=400~600/350~530/1~10 sccm
Processing Time: 60 seconds
(Ashing Process 1)
High Frequency (HF): 600 W
High Frequency (LF): 0 W
Gas: CF$_4$/H$_2$=80~120/160~240 sccm
Processing Time: 60 seconds
(Ashing Process 2)
High Frequency (HF): 600 W
High Frequency (LF): 50 W
Gas: O$_2$=280~420 sccm
Processing Time: 60 seconds FIG. 4 illustrates the results of performing a mask treatment for 5 seconds and performing full etching under the above process conditions. As illustrated in FIG. 4, a CD bias of a line pattern was 14.3 nm, a CD bias of the long diameter of an oval hole pattern was 17.4 nm, and a CD bias of the short diameter of an oval hole pattern was 14.0 nm. Note that CD bias refers to a difference between an initial CD value before etching and a CD value after etching. Also, the CD values represent the line width at mid-height of the line pattern of the mask (in the case of the line CD), and the long diameter and the short diameter of the oval hole pattern (in the case of the hole CD). Note that the illustration of the hole CD (short diameter) corresponds to the illustration of the hole CD (long diameter) rotated by 90 degrees.

As can be appreciated from the results illustrated in FIG. 4, a CD bias (max-min) in the present example was 3.4 nm. Note that CD bias (max-min) refers to a difference between the maximum CD bias value and the minimum CD bias value. The CD bias (max-min) takes into account not only the CD bias of the hole CD but also the CD bias of the line CD. In the present example, the CD bias (max-min) corresponds to a value obtained by subtracting the CD bias of the short diameter of the hole CD from the CD bias of the long diameter of the hole CD (i.e. 17.4-14.0=3.4).

Also, the CD shrink ratio of the long diameter of the hole CD was 1.22 and the CD shrink ratio of the short diameter of the hole CD was 0.98. Note that the above shrink ratio 1.22 corresponds to the ratio of the CD bias of the long diameter of the hole CD to the CD bias of the line CD (i.e. 17.4/14.3), and the above shrink ratio 0.98 corresponds to the ratio of the CD bias of the short diameter of the hole CD to the CD bias of the line CD (i.e. 14.0/14.3).

Note that the CD shrink ratio is preferably as close to 1 as possible. Also, the CD bias (max-min) is preferably as small as possible. As can be appreciated from the above results, by performing a mask treatment for 5 seconds to adjust the shape of the mask before performing an etching process (including a CD shrinking process), the CD shrink ratios of the long diameter and the short diameter of the hole CD may be closer to 1 such that the CD shrink ratios may be improved.

(Full Etching Result 2: Mask Treatment Time 7 Seconds)
In the following, results obtained from performing full etching under the same process conditions as the above Full Etching Result 1 but performing the mask treatment for 7 seconds instead of 5 seconds are described. FIG. 5 illustrates the results obtained from performing full etching after performing the mask treatment for 7 seconds.

As illustrated in FIG. 5, the CD bias of the line pattern was 10.4 nm, the CD bias of the long diameter of the hole pattern was 9.4 nm, and the CD bias of the short diameter of the hole pattern was 11.3 nm. The CD bias (max-min) was 1.9 nm.

Also, the CD shrink ratio of the long diameter of the hole CD was 0.90, and the CD shrink ratio of the short diameter of the hole CD was 1.08. It can be appreciated from the above results that by performing the mask treatment to adjust the mask shape for 7 seconds before performing the full etching process (including a CD shrinking process), the CD shrink ratios of the long diameter and the short diameter of the hole CD may be closer to 1 such that the CD shrink ratios may be improved. Also, it can be appreciated that by changing the mask treatment time from 5 seconds to 7 seconds, a reversal occurs in the magnitude relation between the CD shrink ratio of the long diameter and the CD shrink ratio of the short diameter of the hole CD. Further, it can be appreciated that by changing the mask treatment time from 5 seconds to 7 seconds, the CD bias (max-min) may be reduced to a smaller value indicating that CD variations may be reduced and controllability may be improved.

(Full Etching Result 3: Mask Treatment Time 10 Seconds)
In the following, results obtained from performing the full etching under the same process conditions as the above Full Etching Result 2 but performing the mask treatment for 10 seconds instead of 7 seconds are described. FIG. 6 illustrates the results obtained from performing full etching after performing the mask treatment for 10 seconds.

As illustrated in FIG. 6, the CD bias of the line pattern was 7.3 nm, the CD bias of the long diameter of the hole pattern was 5.7 nm, and the CD bias of the short diameter of the hole pattern was 8.6 nm. The CD bias (max-min) was 2.9 nm.

Also, the CD shrink ratio of the long diameter of the hole CD was 0.79, and the CD shrink ratio of the short diameter of the hole CD was 1.18. As can be appreciated from the above results, by changing the mask treatment time from 7 seconds to 10 seconds, the CD shrink ratio of the long diameter and the short diameter of the hole CD were degraded.

Figure 7A:
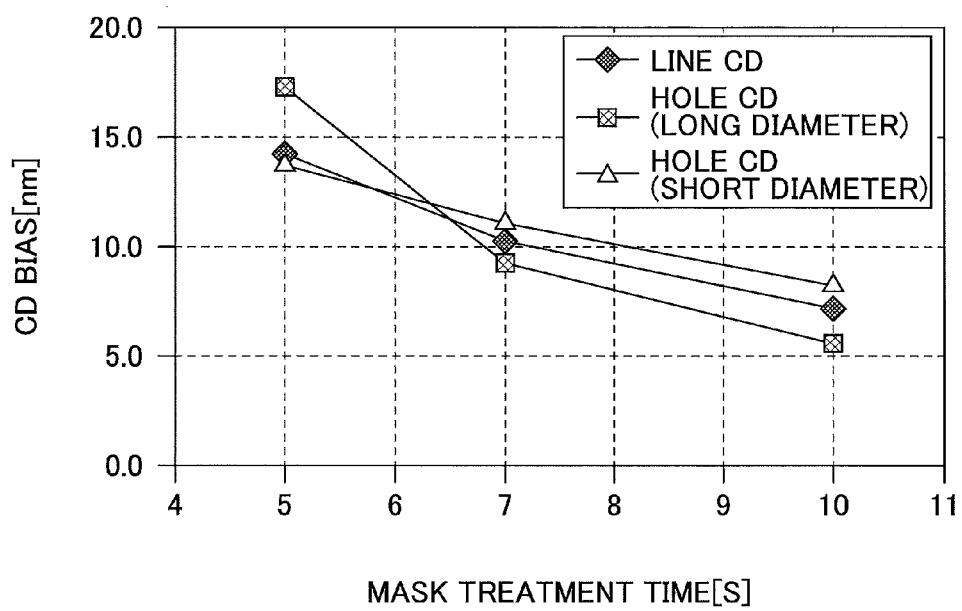
FIGS. 7A and 7B illustrate CD biases depending on the mask treatment time according to an embodiment of the present invention.
Figure 7B:
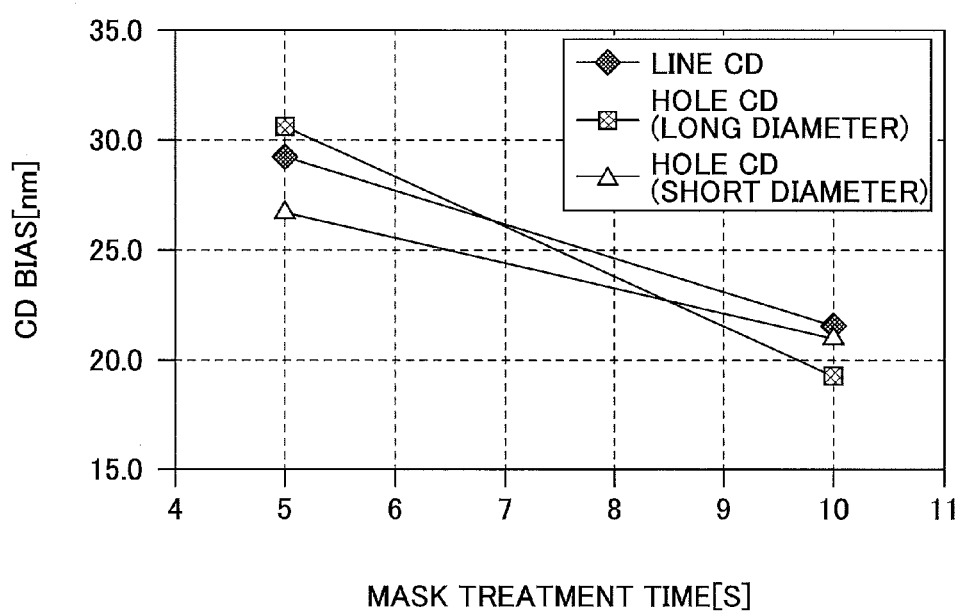

The above results suggest that to improve the CD shrink ratio, it is important to appropriately control the mask treatment time. FIGS. 7A and 7B illustrate CD biases of the line CD, the long diameter of the hole CD, and the short diameter of the hole CD depending on the mask treatment time. FIG. 7A illustrates CD bias values after a full etching process (first etching through aching) is performed. It can be appreciated from FIG. 7A that there is a point at which a reversal occurs in the magnitude relation between the shrink ratio of the long diameter and the shrink ratio of the short diameter depending on the mask treatment time. That is, relative control of the shrink ratio of the long diameter and the shrink ratio of the short diameter may be possible by adjusting the mask treatment time.

(First Etching Result 1: Mask Treatment Time 5 Seconds)
In the following, results obtained from performing the mask treatment and the first etching process under the same process conditions as the above Full Etching Result 1 are described. FIG. 8 illustrates the results obtained from performing the first etching process after performing the mask treatment for 5 seconds.

As illustrated in FIG. 8, the CD bias of the line pattern was 29.2 nm, the CD bias of the long diameter of the hole pattern was 30.8 nm, and the CD bias of the short diameter of the hole pattern was 27.0 nm. The CD bias (max-min) was 3.8 nm.

Also, the CD shrink ratio of the long diameter of the hole CD was 1.05, and the CD shrink ratio of the short diameter of the hole CD was 0.92. It can be appreciated from the above results that by performing a mask treatment to adjust the mask shape for 5 seconds before performing the first etching process (including a CD shrinking process), the CD shrink ratios of the long diameter and the short diameter of the hole CD may be closer to 1; that is, improvement of the CD shrink ratio from performing the mask treatment can already be observed after performing the first etching process.

(First Etching Result 2: Mask Treatment Time 7 Seconds)

In the following, results obtained from performing the mask treatment and the first etching process under the same process conditions as the above Full Etching Result 1 (and First Etching Result 1) but changing the mask treatment time from 5 seconds to 7 seconds are described. FIG. 9 illustrates the results obtained from performing the first etching process after performing the mask treatment for 7 seconds.

As illustrated in FIG. 9, the CD bias of the line pattern was 21.6 nm, the CD bias of the long diameter of the hole pattern was 19.5 nm, and the CD bias of the short diameter of the hole pattern was 21.2 nm. The CD bias (max-min) was 2.1 nm.

Also, the CD shrink ratio of the long diameter of the hole CD was 0.90, and the CD shrink ratio of the short diameter of the hole CD was 0.98. It can be appreciated from the above results that by performing a mask treatment to adjust the mask shape for 7 seconds before performing the first etching process (including a CD shrinking process), the CD shrink ratios of the long diameter and the short diameter of the hole CD may be closer to 1; that is, improvement of the CD shrink ratio can already be observed after performing the first etching process. Also, it can be appreciated from the above results that a reversal occurs in the magnitude relation between the shrink ratio of the long diameter and the shrink ratio of the short diameter when the mask treatment time is changed from 5 seconds to 7 seconds.

(First Etching Result 3: Mask Treatment Time 10 Seconds)

In the following, results obtained from performing the mask treatment for 10 seconds and then performing the first etching process under the following process conditions are described with reference to FIG. 10.

<Process Conditions>

The process conditions used in the present example are indicated below. Note that the process conditions of the mask treatment were the same as the above Full Etching Result 1 (and First Etching Result 1) except that the processing time was set to 10 seconds.

(First Etching)
High Frequency (HF): 400 W
High Frequency (LF): 100 W
Gas: $CF_4/CH_4/O_2$=120~200/5~20/1~10 sccm
Processing Time: 45 seconds FIG. 10 illustrates the results obtained from performing the first etching process under the above process conditions after performing the mask treatment for 10 seconds.

As illustrated in FIG. 10, the CD bias of the line pattern was 13.6 nm, the CD bias of the long diameter of the hole pattern was 9.8 nm, and the CD bias of the short diameter of the hole pattern was 12.9 nm. The CD bias (max-min) was 3.8 nm.

Also, the CD shrink ratio of the long diameter of the hole CD was 0.72, and the CD shrink ratio of the short diameter of the hole CD was 0.95. It can be appreciated from the above results that when the mask treatment time is changed from 7 seconds to 10 seconds, the resulting CD shrink ratios are inferior to the results obtained from the case of performing the mask treatment time for 7 seconds even when the process conditions (e.g. RF power, gas type) are changed.

It can be appreciated from the above results and FIG. 7B illustrating CD biases after performing the first etching process that there is a point at which a reversal occurs in the magnitude relation between the shrink ratio of the long diameter and the shrink ratio of the short diameter depending on the mask treatment time. That is, even in the first etching process, relative control of the shrink ratio of the long diameter and the shrink ratio of the short diameter may be possible by adjusting the mask treatment time.

(Mask Treatment Result 1: Mask Treatment Time 5 Seconds)

Figure 11:
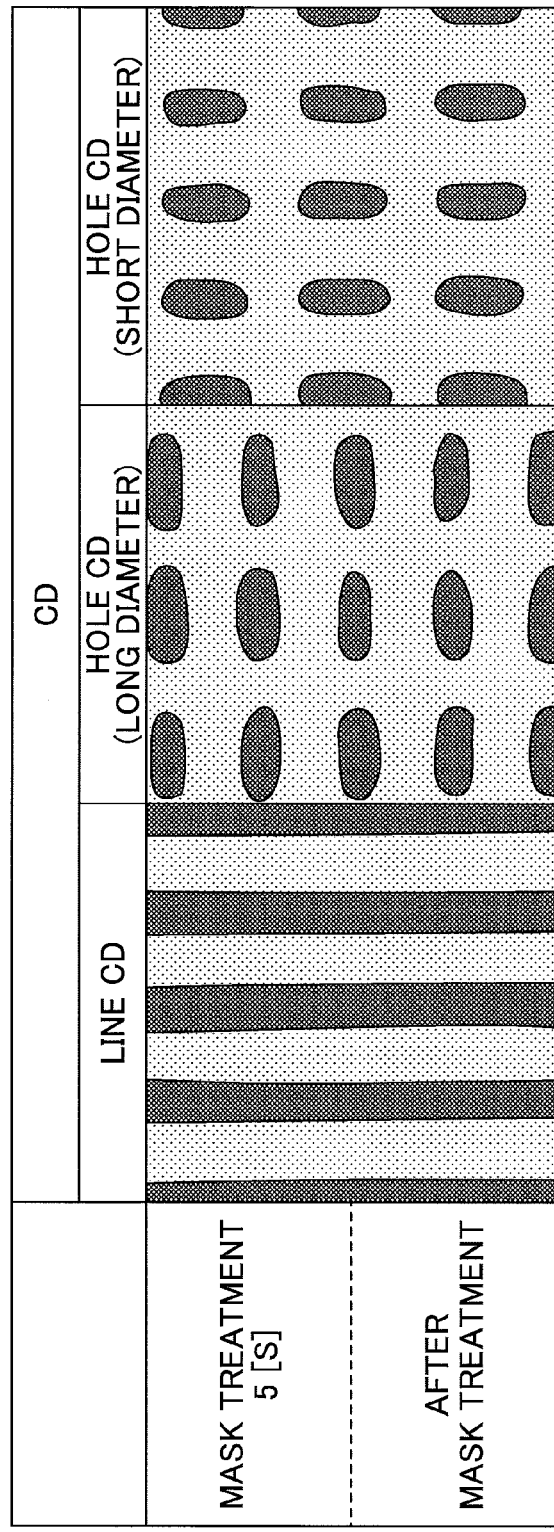
FIG. 11 illustrates exemplary results of performing an etching method according to an embodiment of the present invention.

In the following, results obtained from performing the mask treatment for 5 seconds under the same process conditions as the above Full Etching Result 1 are described. FIG. 11 illustrates the results obtained after performing the mask treatment for 5 seconds.

As illustrated in FIG. 11, the CD bias of the line pattern was 5.2 nm, the CD bias of the long diameter of the hole pattern was 8.1 nm, and the CD bias of the short diameter of the hole pattern was 6.9 nm. The CD bias (max-min) was 2.9 nm.

Also, the CD shrink ratio of the long diameter of the hole CD was 1.56, and the CD shrink ratio of the short diameter of the hole CD was 1.32.

(Mask Treatment Result 2: Mask Treatment Time 7 Seconds)

In the following, results obtained from performing the mask treatment under the same process conditions as the above Full Etching Result 1 but changing the processing time from 5 seconds to 7 seconds are described. FIG. 12 illustrates the results obtained after performing the mask treatment for 7 seconds.

As illustrated in FIG. 12, the CD bias of the line pattern was 4.0 nm, the CD bias of the long diameter of the hole pattern was 4.1 nm, and the CD bias of the short diameter of the hole pattern was 2.4 nm. The CD bias (max-min) was 1.7 nm.

Also, the CD shrink ratio of the long diameter of the hole CD was 1.04, and the CD shrink ratio of the short diameter of the hole CD was 0.60. It can be appreciated from the above results that by changing the mask treatment time from 5 seconds to 7 seconds, the CD shrink ratio of the long diameter and the CD shrink ratio of the short diameter may become smaller.

(Mask Treatment Result 3: Mask Treatment Time 20 Seconds)

When the mask treatment was performed for 20 seconds under the same process conditions as the above Full Etching Result 1, the mask pattern was lost. Based on the above, it can be appreciated that the processing time of the mask treatment is preferably less than 20 seconds. Also, by setting the processing time of the mask treatment to at least 5 seconds, desirable CD shrink ratios may be obtained without losing the desired mask pattern. Thus, the processing time of the mask treatment is preferably at least 5 seconds and less than 20 seconds.

(First Etching Result from Gas Flow Rate Change: Mask Treatment Time 10 Seconds)

In the following, results obtained from performing the first etching process under the process conditions indicated below (with a change in the gas flow rate) after performing the mask treatment for 10 seconds are described. FIG. 13 illustrates the results obtained from performing the first etching process with the gas flow rate change after performing the mask treatment for 10 seconds.

Note that the shrink ratio of the short diameter with respect to the long diameter indicated in FIG. 12 is a smaller value than the shrink ratio of the short diameter with respect to the long diameter indicated in FIG. 11. Thus, to adjust the shrink ratio to be closer to 1, in the process described below, the gas flow rate of methane gas ($CH_4$) included in the etching gas was increased such that the amount of deposits generated during the first etching process may be increased.

<Process Conditions>

Process conditions used in the present example are indicated below. Note that the process conditions of the mask treatment were the same as the above Full Etching Result 1 except that the processing time was set to 10 seconds.

(First Etching)
High Frequency (HF): 500 W
High Frequency (LF): 100 W
Gas: $CF_4/CH_4$=160~240/10~20 sccm
Processing Time: 45 seconds As illustrated in FIG. 13, the CD bias of the line pattern was 15.6 nm, the CD bias of the long diameter of the hole pattern was 16.0 nm, and the CD bias of the short diameter of the hole pattern was 16.6 nm. The CD bias (max-min) was 1.0 nm.

Also, the CD shrink ratio of the long diameter of the hole CD was 1.02, and the CD shrink ratio of the short diameter of the hole CD was 1.07. It can be appreciated from the above results that by setting the mask treatment time to 10 seconds and increasing the flow rate of $CH_4$ gas included in the etching gas in the first etching process to thereby increase the amount of deposits generated in the first etching process, the CD shrink ratios may be closer to 1 indicating favorable results.

Note that although only $CF_4$ gas and $CH_4$ gas are indicated as the types of gases included in the etching gas in the process conditions described above, the etching gas may be any gas mixture including $CF_4$ gas and $CH_4$ gas.

(Step-by-Step Check Result)

In the following, results of checking each of the process steps including the mask treatment, the first etching, the second etching, and the third etching are described. Note that the process conditions described above in connection with the Full Etching Result 1 were used in each of the process steps.

Figure 14A:
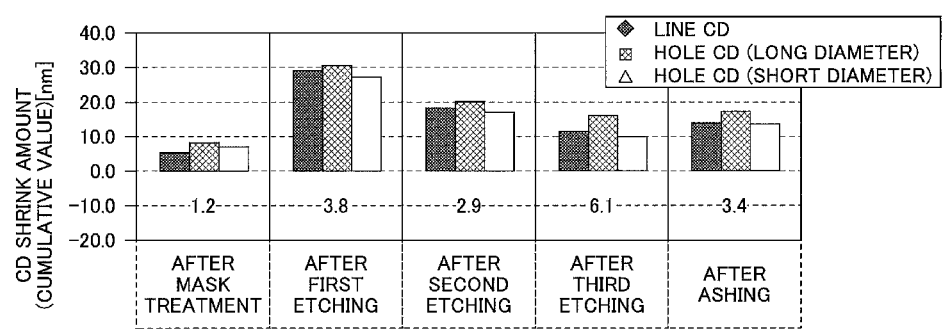
FIGS. 14A and 14B illustrate CD shrink amounts at each process step according to an embodiment of the present invention.
Figure 14B:
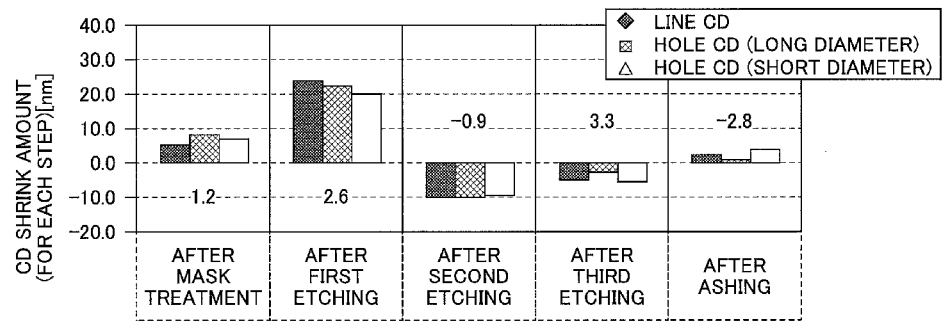

FIG. 14A represents cumulative values of the amount of CD shrinkage after performing each of the process steps; and FIG. 14B represents the amount of CD shrinkage at each of the process steps. It can be appreciated from these results that a relatively large amount of CD shrinkage is obtained after performing the first etching step and the third etching step. Also, the direction of shrinkage is in the positive direction (CD shrinking direction) in the first etching step while the direction of shrinkage is in the negative direction (CD expanding/adjusting direction) in the third step.

Note that the numerical values indicated in FIGS. 14A and 14B represent the difference between the CD bias value of the long diameter and the CD bias value of the short diameter of the hole CD. It can be appreciated that in the first etching step and the third etching step, the numeric values representing the difference between the CD bias value of the long diameter and the CD bias value of the short diameter are relatively larger compared to the other process steps. This indicates that in the first etching step and the third etching step, the difference in the CD variations (CD bias) of the long diameter and the short diameter is relatively large. Such a result in the first etching step may be attributed to the fact that $CH_4$ gas supplied during the first etching affects the amount of deposits generated in the first etching step, and this may in turn affect the shrink ratio, for example.

In the case of the third etching step, a recess formed in the polysilicon film 114 during etching may have an adverse effect on the shrink ratio, for example.

Further, in the ashing step performed after the third etching step, the CD shrink ratios and the difference between the CD bias value of the long diameter and the CD bias of the short diameter indicate changes in the opposite direction with respect to the previous step. Thus, the ashing step may be performed after the third etching step to improve the CD shrink ratio.

(Gas Type Change)

In the following, results obtained from changing the type of gas included in the treatment gas used in the mask treatment are described with reference to FIGS. 15-17.

(Mask Treatment: Gas Type 1)

FIG. 15 illustrates results obtained from performing a mask treatment using a treatment gas as prescribed by the following process conditions.

<Process Conditions>
High Frequency (HF): 300 W
High Frequency (LF): 0 W
Gas: $H_2/Ar$=80~120/640~960 sccm
Processing Time: 20 seconds As illustrated in FIG. 15, the CD bias of the line pattern was 6.0 nm, the CD bias of the long diameter of the hole pattern was 10.4 nm, and the CD bias of the short diameter of the hole pattern was 6.2 nm. The CD bias (max-min) was 4.4 nm.

Also, the CD shrink ratio of the long diameter of the hole CD was 1.73, and the CD shrink ratio of the short diameter of the hole CD was 1.02. It can be appreciated from the above results that the CD shrink values may be desirably controlled when the mask treatment time is set to 20 seconds and a mixed gas including hydrogen ($H_2$) gas and argon (Ar) gas is used as the treatment gas.

(Mask Treatment: Gas Type 2)

FIG. 16 illustrates results of performing a mask treatment using a treatment gas as prescribed by the following process conditions.

<Process Conditions>
High Frequency (HF): 800 W
High Frequency (LF): 100 W
Gas: $H_2/N_2$=160~240/80~120 sccm
Processing Time: 5 seconds As illustrated in FIG. 16, the CD bias of the line pattern was 8.7 nm, the CD bias of the long diameter of the hole pattern was 15.2 nm, and the CD bias of the short diameter of the hole pattern was 8.0 nm. The CD bias (max-min) was 7.2 nm.

Also, the CD shrink ratio of the long diameter of the hole CD was 1.75, and the CD shrink ratio of the short diameter of the hole CD was 0.92. It can be appreciated from the above results that the CD shrink values may be desirably controlled when a gas mixture including hydrogen ($H_2$) gas and nitrogen ($N_2$) gas is used as the treatment gas.

Note that in other examples, instead of using a gas mixture including hydrogen gas and argon gas, or a gas mixture including hydrogen gas and nitrogen gas as described above, a gas mixture including hydrogen gas, argon gas, and an inert gas other than nitrogen ($N_2$) gas may be supplied as the treatment gas, and a plasma generated from such a treatment gas may be used to perform the mask treatment on the mask PR.

(Mask Treatment: Gas Type 3)

FIG. 17 illustrates results obtained from performing a mask treatment using a treatment gas as prescribed by the following process conditions.

<Process Conditions>
High Frequency (HF): 500 W
High Frequency (LF): 100 W
Gas: $CF_4$=100~160 sccm
Processing Time: 5 seconds As illustrated in FIG. 17, the CD bias of the line pattern was 13.8 nm, the CD bias of the long diameter of the hole pattern was 15.6 nm, and the CD bias of the short diameter of the hole pattern was 12.5 nm. The CD bias (max-min) was 3.1 nm.

Also, the CD shrink ratio of the long diameter of the hole CD was 1.13, and the CD shrink ratio of the short diameter of the hole CD was 0.91. It can be appreciated from the above results that the CD shrink values may also be desirably controlled when a gas mixture including carbon tetrafluoride ($CF_4$) gas is used as the treatment gas.

Note that in other examples, instead of using a gas mixture including carbon tetrafluoride gas as described above, a gas mixture including difluoro methane ($CH_2F_2$) gas may be supplied as the treatment gas, and a plasma generated from such a treatment gas may be used to perform a mask treatment on the mask PR.

According to an aspect of the etching method according to the present invention, the CD shrink ratio of an etching pattern may be controlled.

Although illustrative embodiments of an etching method according to the present invention have been described above, the present invention is not limited to these embodiments but includes other variations and modifications that may be made within the spirit and scope of the present invention. Further, the various embodiments and modifications may be combined to the extent practicable.

For example, in the etching method according to the embodiments described above, the vertical to horizontal CD shrink ratio is controlled to be close to 1:1. However, the manner of controlling the shrink ratio is not limited to the above. For example, in an etching method according to an embodiment of the present invention, only the vertical CD shrink ratio may be controlled, or only the horizontal CD shrink ratio may be controlled.

Also, examples of plasma generating means of an apparatus that executes the etching method according to the present invention include a capacitively coupled plasma (CCP) generating unit, an inductively coupled plasma (ICP) generating unit, a helicon wave plasma (HWP) generating unit, a microwave surface wave plasma generating unit for generating a microwave plasma such as a slot plane antenna (SPA) plasma or a microwave plasma generated from a radial line slot antenna, an electron cyclotron resonance plasma (ECR) generating unit, and a remote plasma generating unit using the above plasma generating units.

Also, note that the substrate subject to processing in the present invention is not limited to a semiconductor wafer, but may be a large-sized substrate for a flat panel display, or a substrate for a solar cell or an EL element, for example.

What is claimed is:

1. An etching method for performing an etching process on an etching target film arranged on a substrate, the etching method comprising the steps of:
   supplying a treatment gas including a halogen-containing gas, hydrogen gas, an inert gas, and oxygen gas, and performing a treatment on a patterned mask arranged on the etching target film using a plasma generated from the treatment gas; and
   etching the etching target film that has undergone the treatment using a plasma generated from an etching gas,
   wherein the treatment gas includes carbon dioxide.

2. The etching method as claimed in claim 1, wherein the treatment is performed for a time period greater than or equal to 5 seconds and less than 20 seconds.

3. The etching method as claimed in claim 1, wherein the etching target film is a silicon-containing film.

\* \* \* \* \*